United States Patent
Goo et al.

(10) Patent No.: US 7,221,014 B2
(45) Date of Patent: May 22, 2007

(54) DRAM DEVICES HAVING AN INCREASED DENSITY LAYOUT

(75) Inventors: Doo-hoon Goo, Gyeonggi-do (KR); Jung-hyeon Lee, Gyeonggi-do (KR); Gi-sung Yeo, Seoul (KR); Han-ku Cho, Gyeonggi-do (KR); Sang-gyun Woo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/015,993

(22) Filed: Dec. 17, 2004

(65) Prior Publication Data

US 2005/0269615 A1   Dec. 8, 2005

(30) Foreign Application Priority Data

Jun. 2, 2004   (KR)   ................. 10-2004-0039977

(51) Int. Cl.
*H01L 29/74*   (2006.01)
*H01L 29/76*   (2006.01)

(52) U.S. Cl. ................. 257/296; 257/211; 257/306; 257/298; 257/300

(58) Field of Classification Search ................. 257/211, 257/296, 304, 311, 303, 300, 306, 302, 212, 257/213
See application file for complete search history.

(56) References Cited

U.S. PATENT DOCUMENTS

| | | | |
|---|---|---|---|
| 5,877,522 A | 3/1999 | Kasai | ................. 257/306 |
| 6,097,621 A * | 8/2000 | Mori | ................. 365/63 |
| 6,809,364 B2 * | 10/2004 | Matsuoka et al. | ................. 257/296 |
| 6,882,556 B2 * | 4/2005 | Fuhrmann et al. | ................. 365/63 |
| 2004/0195594 A1 | 10/2004 | Tran et al. | ................. 257/206 |

FOREIGN PATENT DOCUMENTS

| | | |
|---|---|---|
| JP | 10098168 | 3/1999 |
| KR | 10200300586601 | 7/2003 |
| KR | 1020030092861 | 12/2003 |
| KR | 10-2004-0012545 | 2/2004 |

OTHER PUBLICATIONS

Notice to Submit a Response for Korean Patent Application No. 10-2004-0039977 mailed on Feb. 25, 2006.

* cited by examiner

*Primary Examiner*—Evan Pert
*Assistant Examiner*—Fazli Erdem
(74) *Attorney, Agent, or Firm*—Myers Bigel Sibley & Sajovec (57) ABSTRACT

DRAM devices include a plurality of word lines extending in a first direction and a plurality of bit lines extending in a second direction and intersecting the word lines. A plurality of active regions is provided that are electrically coupled to the word lines and the bit lines. Each of the active regions defines a single unit memory cell having an area of $6F^2$ in terms of a minimum line width F. Each of the active regions may be overlapped by only one word line and the active regions may be defined by an isolation region.

20 Claims, 8 Drawing Sheets

DRAM DEVICES HAVING AN INCREASED DENSITY LAYOUT

CROSS-REFERENCE TO RELATED APPLICATION

This application claims priority from Korean Patent Application No. 2004-39977, filed on Jun. 2, 2004, in the Korean Intellectual Property Office, the disclosure of which is incorporated herein in its entirety by reference.

BACKGROUND OF THE INVENTION

The present invention relates to semiconductor memory devices, and more particularly, to dynamic random access memory (DRAM) devices.

The demand for DRAM devices continues to rise, particularly for large capacity DRAM devices. However, chip size limitations generally limit the capacity of the DRAM devices. As the chip size increases, to provide for a greater capacity, the number of chips per wafer in the manufacturing process decreases. Furthermore, the manufacturing yield for the DRAM devices may decrease. Therefore, various approaches have been proposed for increasing the number of memory cells per wafer by modifying cell layout to decrease the cell area per memory cell. In some of these proposed approaches, a conventional $8F^2$ layout is changed to a $6F^2$ layout.

Figure 1:
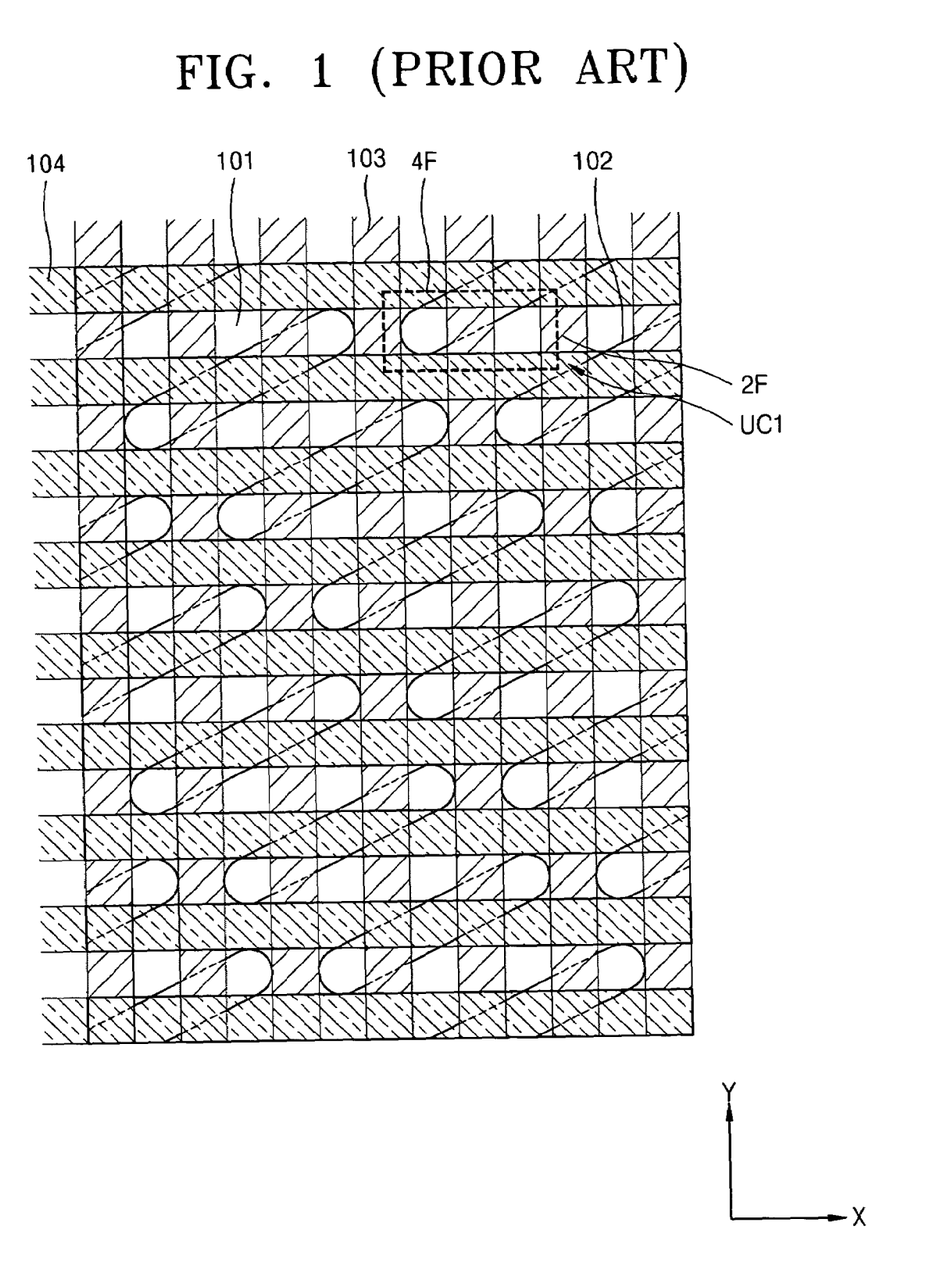
FIG. 1 is a layout view illustrating a conventional DRAM device having an $8F^2$ layout and diagonal active regions.

FIG. 1 is a layout view showing a conventional DRAM device having $8F^2$ layout and diagonal active regions. Active regions 102 defined by an isolation region 101 are repeatedly disposed with a predetermined spacing. The active regions 102 have a shape that will be referred to herein as a two-curved-end bar. The active regions 102 may have other shapes. The active regions 102 are illustrated as slanted with reference to a horizontal direction X. The slanted active regions 102 are sometimes referred to as diagonal active regions. Word lines 103, comprising gate conductive layers, extend linearly in a vertical direction Y in a striped pattern. Bit lines 104, comprising bitline conductive layers, extend linearly in the horizontal direction X in a striped pattern. Two word lines 103 and one bit line 104 intersect each other in a single active region 102. In a DRAM having such a structure, a unit cell UC1 has horizontal and vertical lengths of 4F and 2F, respectively, in terms of a minimum line width F. Therefore, an area of the unit cell UC1 is $8F^2$. There are two unit cells UC1 in a single active region 102.

Figure 2:
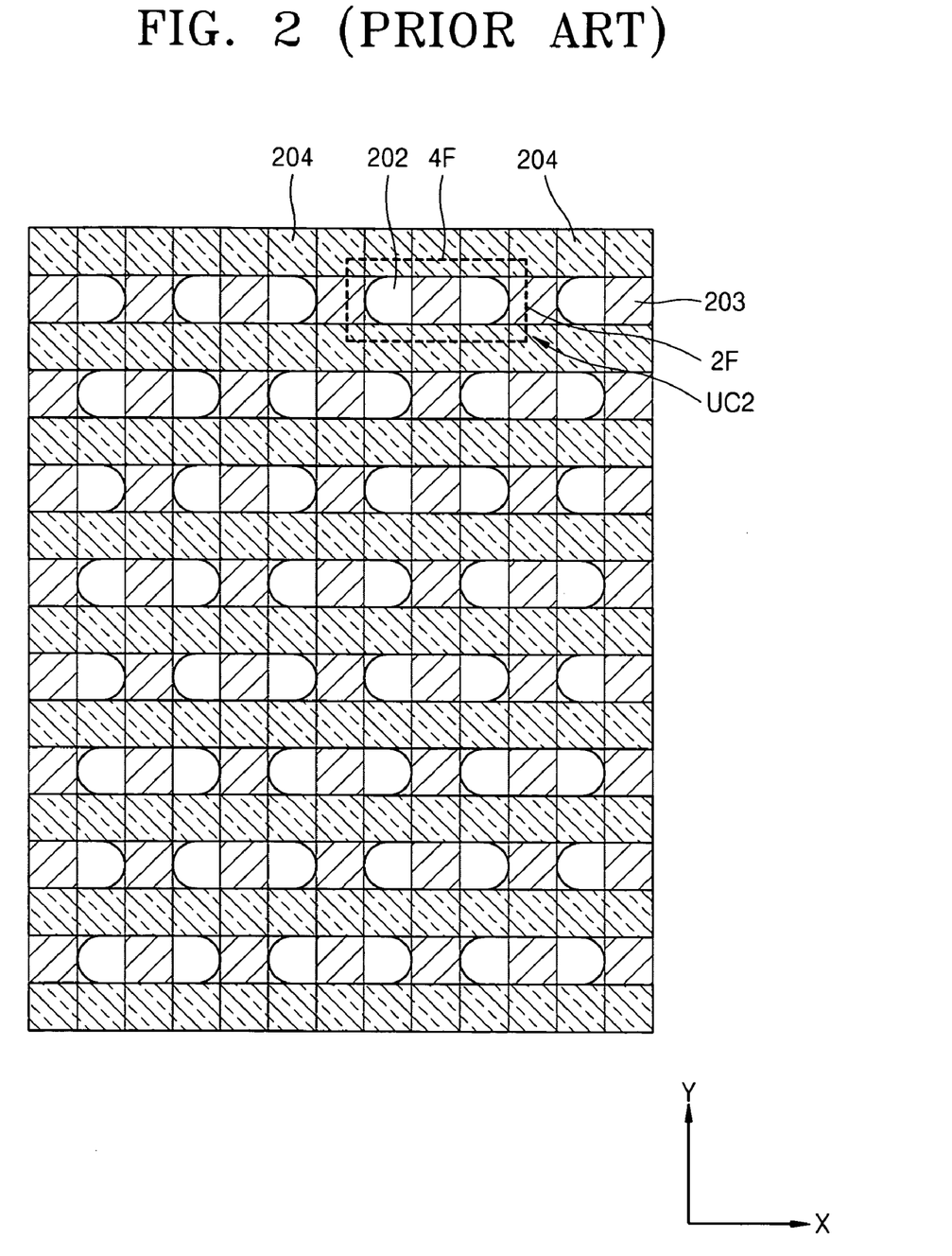
FIG. 2 is a layout view illustrating a conventional DRAM device having an $8F^2$ layout and split active regions.

FIG. 2 is a layout view showing a conventional DRAM device having an $8F^2$ layout and split active regions. Active regions 202 have a shape of a two-curved-end bar. The active regions 202 lie in the horizontal direction X. Upper and lower adjacent active region 202 are disposed in a zigzag pattern. Each of word lines 203 extend in the vertical direction Y in a striped pattern and overlap with at least one of the adjacent active regions 202 disposed in a zigzag pattern. Bit lines 204 extend in the horizontal direction X in a striped pattern between the adjacent active regions 202 disposed in a zigzag pattern. In a DRAM having the illustrated structure of FIG. 2, a unit cell UC2 has horizontal and vertical lengths of 4F and 2F, respectively, in terms of a minimum line width F. Therefore, an area of the unit cell UC2 is also $8F^2$. Unlike the DRAM device having diagonal active regions as illustrated in FIG. 1, there is only a single unit cell UC2 in a single active region 202.

DRAM devices having a $6F^2$ layout have been proposed to replace the conventional DRAM having an $8F^2$ layout. In a DRAM device having a $6F^2$ layout, a unit cell generally has horizontal and vertical lengths of 3F and 2F, respectively, in terms of a minimum line width F. Therefore, an area of the unit cell is $6F^2$, so that the degree of integration of the DRAM device can be increased. DRAM devices having a $6F^2$ layout typically have diagonal active regions. In general, there are two unit cells in a single active region. The degree of integration of a DRAM device having a $6F^2$ layout can typically be increased in comparison to a DRAM having an $8F^2$ layout. However, it may be difficult to form the diagonal active regions with a high degree of integration in a DRAM device having a $6F^2$ layout. For example, a mask for the diagonal active regions is typically implemented by forming a large number of small segments. This is generally a very time-consuming and high-cost process. Moreover, for an asymmetrical layout, the associated patterning process using photolithography may be very difficult.

SUMMARY OF THE INVENTION

In some embodiments of the present invention, DRAM devices include a plurality of word lines extending in a first direction and a plurality of bit lines extending in a second direction and intersecting the word lines. A plurality of active regions is provided that are electrically coupled to the word lines and the bit lines. Each of the active regions defines a single unit memory cell having an area of $6F^2$ in terms of a minimum line width F. Each of the active regions may be overlapped by only one word line and the active regions may be defined by an isolation region.

In further embodiments of the present invention, the active regions are arranged in rows extending in the second direction and two rows of active regions are positioned between an adjacent pair of the bit lines. The two rows of active regions may be arranged in a zigzag pattern. The active regions may have a bar shape with curved ends.

In other embodiments of the present invention, the plurality of active regions includes a first set of active regions aligned with a first line extending in the second direction and a second set of active regions aligned with a second line extending in the second direction. The first set and second set of active regions extend between upper and lower adjacent ones of the plurality of bit lines and the first and second lines are proximate the upper and lower bit lines, respectively. The first and second sets of active regions may be disposed in a zigzag pattern.

In further embodiments of the present invention, direct contacts are provided electrically connecting the active regions to the bit lines. Buried contacts are provided electrically connecting the active regions to overlying layers of the DRAM device, such as a lower electrode of a capacitor associated with a unit memory cell.

In yet other embodiments of the present invention, ones of the direct contacts are formed on both a first impurity region of one of the first set of active regions and a second impurity region of an associated one of the second set of active regions. One of the buried contacts is formed on a second impurity region of the one of the first set of active regions and another of the buried contacts is formed on a first impurity region of the one of the second set of active regions. The first and second impurity regions of the active regions are partitioned by one of the word lines. A direct contact plug may be disposed on each of the direct contacts to connect the direct contacts to corresponding ones of the plurality of bit lines.

In further embodiments of the present invention, one of the direct contacts is formed on a first impurity region of each of the first set of active regions and another one of the direct contacts is formed on a second impurity region of an associated one of the second set of active regions. One of the buried contacts is formed on a second impurity region of each of the first set of active regions and another of the buried contacts is formed on a first impurity region of each of the second set of active regions. The first and second impurity regions of each of the active regions are partitioned by one of the word lines. A direct contact plug may be disposed on the one of the direct contacts and the another one of the direct contacts for an associated one of the first set of active regions and one of the second set of active regions that connects the one of the direct contacts and the another one of the direct contacts.

In other embodiments of the present invention, DRAM devices include a plurality of word lines extending in a first direction and a plurality of bit lines extending in a second direction and intersecting the word lines. A plurality of active regions are arranged in rows extending in the second direction. Two rows of the active regions are positioned between an adjacent pair of the bit lines. Each of the active regions may be overlapped by only one word line and define a single unit memory cell and the active regions may be defined by an isolation region. The two rows of the active regions may be arranged in a zigzag pattern. Direct contacts may electrically connect the active regions to the bit lines and buried contacts may electrically connect the active regions to overlying layers of the DRAM device.

In yet further embodiments of the present invention, DRAM devices include word lines extending in a first direction and bit lines extending in a second direction and intersecting the word lines. Active regions are defined by an isolation region and a single word line is overlapped with a single active region so that a single unit memory cell is formed in the single active region. Two active regions are disposed in a zigzag pattern in the first direction between adjacent ones of the bit lines. The unit memory cell may have an area of $6F^2$ in terms of a minimum line width F.

BRIEF DESCRIPTION OF THE DRAWINGS

The above and other features and advantages of the present invention will become more apparent by describing in detail some embodiments thereof with reference to the attached drawings, in which.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
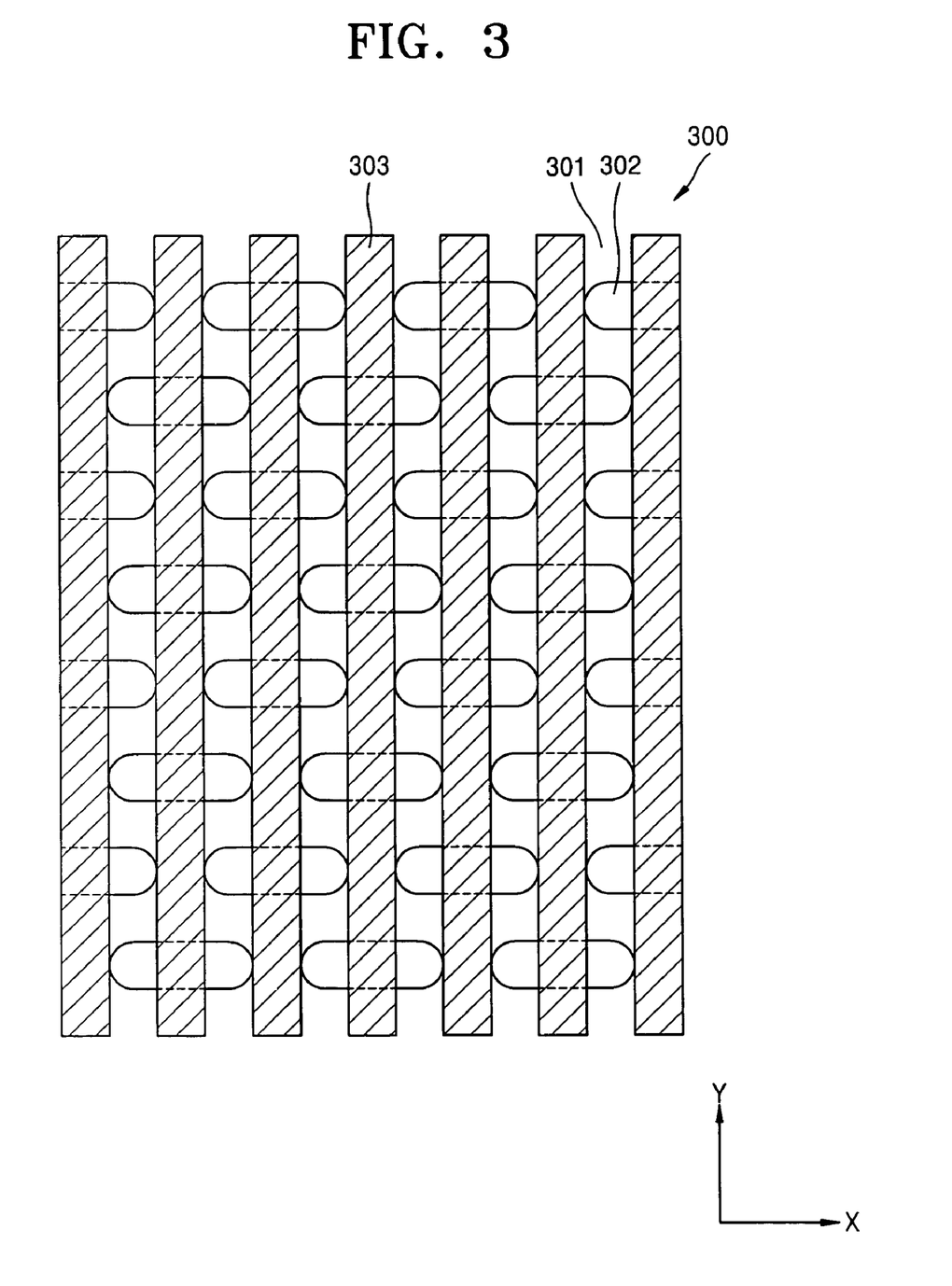
FIG. 3 is a layout view illustrating active regions and word lines in a DRAM device having a $6F^2$ layout according to some embodiments of the present invention.
Figure 4:
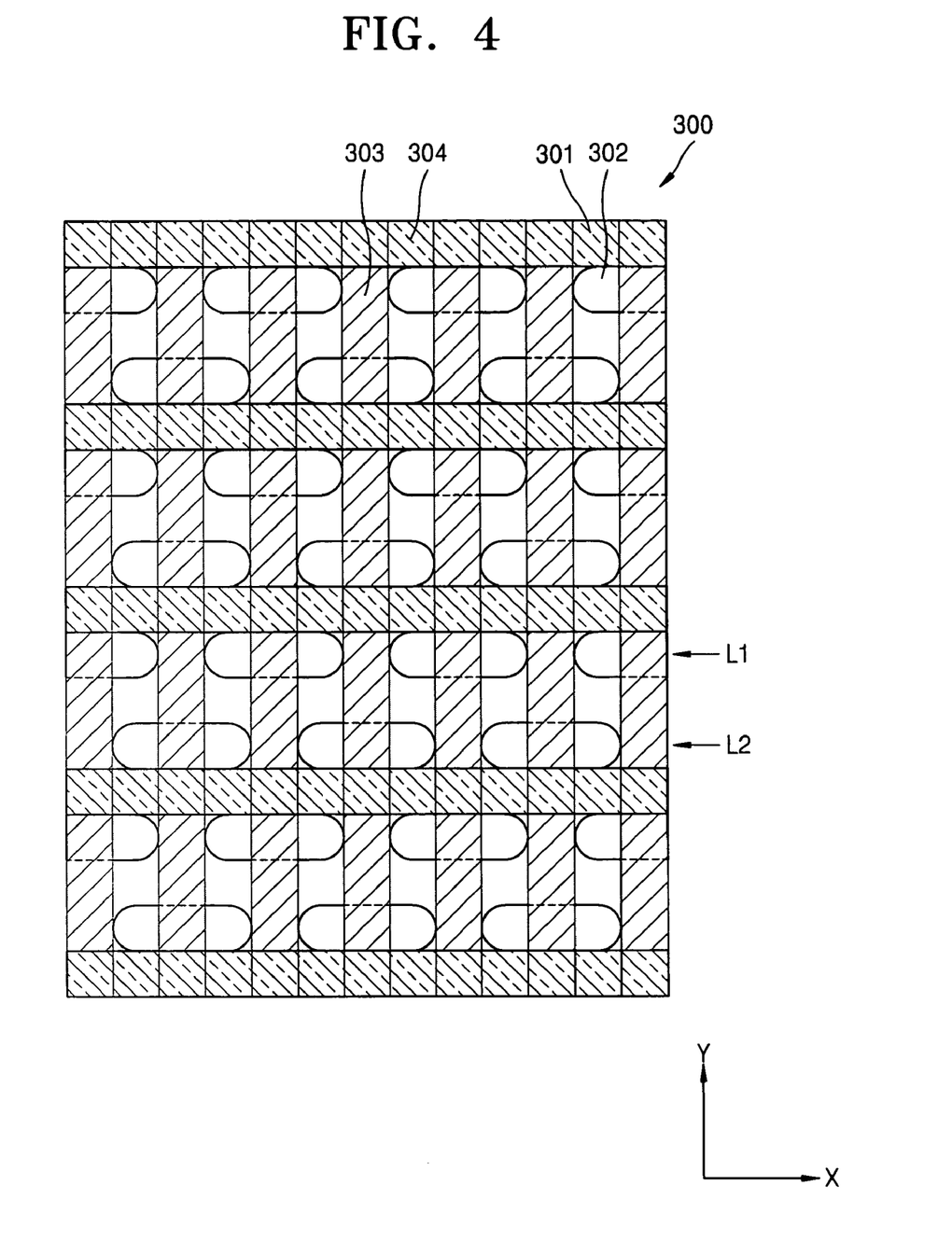
FIG. 4 is a layout view illustrating the active regions and bit lines in the DRAM device of FIG. 3.

Various embodiments of the present invention will now be described with reference to FIGS. 3 through 8. FIG. 3 is a layout (plane) view illustrating active regions and word lines in a DRAM device having a $6F^2$ layout according to some embodiments of the present invention. FIG. 4 is a layout view illustrating the active regions and bit lines in the DRAM device of FIG. 3.

As shown in the embodiments of FIG. 3, the DRAM device 300 includes a plurality of active regions 302, a plurality of word lines 303, and a plurality of bit lines 304. The active regions 302 are defined by an isolation region 301. Each of the active regions 302 is shown as having a bar shape with curved ends (shown as semi-circles on each end in FIG. 3). Adjacent active regions 302 are disposed in a zigzag pattern. A right-handed portion of a respective active region 302 is aligned with left-handed portions of adjacent active regions 302 in the vertical direction Y appearing as upper and lower adjacent active regions 302 as illustrated in FIG. 3. Similarly, a left-handed portion of a respective active region 302 is aligned with right-handed portions of further adjacent upper and lower active regions 302 in the vertical direction Y. The word lines 303 extend in the vertical direction Y in a striped pattern. Each of the word lines 303 overlaps a central portion of one of two adjacent active regions 302 in the zigzag pattern (i.e., overlapping an active region 302 in one X direction row and not in an adjacent X direction row). The two portions of the active region 302 partitioned by the one word line 303 may be used for impurity doped regions, such as source and drain regions of a transistor device:

Referring now to FIG. 4, the bit lines 304 are shown as extending in the horizontal direction X in a striped pattern. As such, the bit lines 304 intersect the word lines 303. Between adjacent bit lines 304, there are two adjacent rows/lines of active regions 302 extending in the horizontal direction X: a first line L1 and a second line L2, in which the adjacent lines of active regions 302 are disposed in a zigzag pattern. Each of the active regions 302 constitutes a single unit cell. Therefore, the unit cells are aligned with the first and second lines L1 and L2 between the adjacent bit lines 304.

Figure 5:
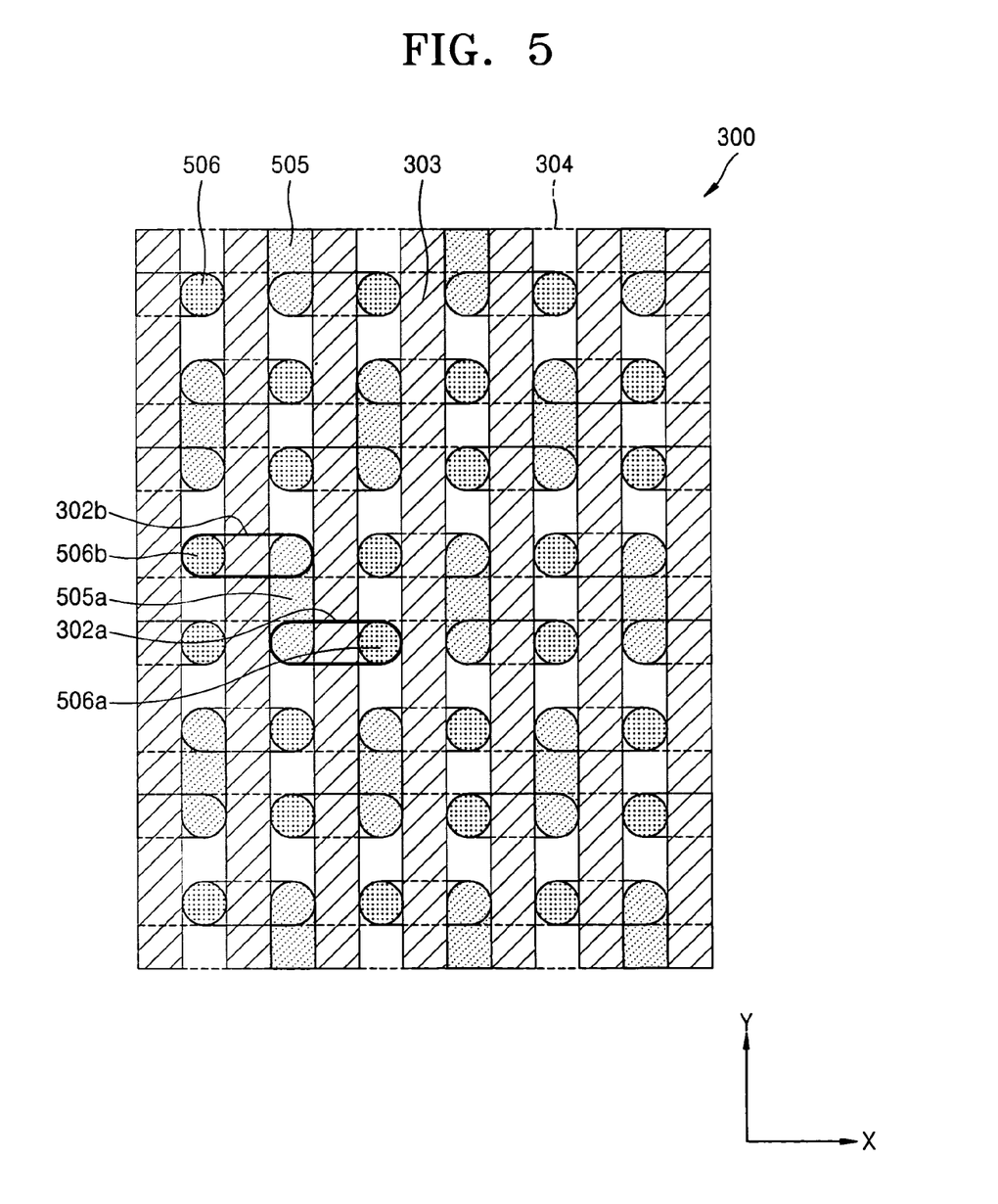
FIG. 5 is a layout view illustrating buried contacts and direct contacts in a DRAM device having a $6F^2$ layout according to some embodiments of the present invention.

FIG. 5 is a layout view illustrating buried contacts 506 and direct contacts 505 in a DRAM device having a $6F^2$ layout according to some embodiments of the present invention. As shown in the embodiments of FIG. 5, the direct contacts 505, shown as extending in the Y-direction in FIG. 5, are electrically connected to impurity regions of the active regions 302 and to bit lines 304. The buried contacts 506 are electrically connected to impurity regions of the active regions 302 and to lower electrodes of capacitors (not shown). Each of the direct contacts 505 associated with a bit line 304 is connected to an impurity region of an upper active region 302 above the bit line 304 and an impurity region of a lower active region 302 below the bit line 304 in the illustration of FIG. 5. Each of the buried contacts 506 associated with a bit line 304 is connected to an impurity region of an upper active region 302 above the bit line 304 or an impurity region of a lower active region 302 below the bit line 304.

Figure 6:
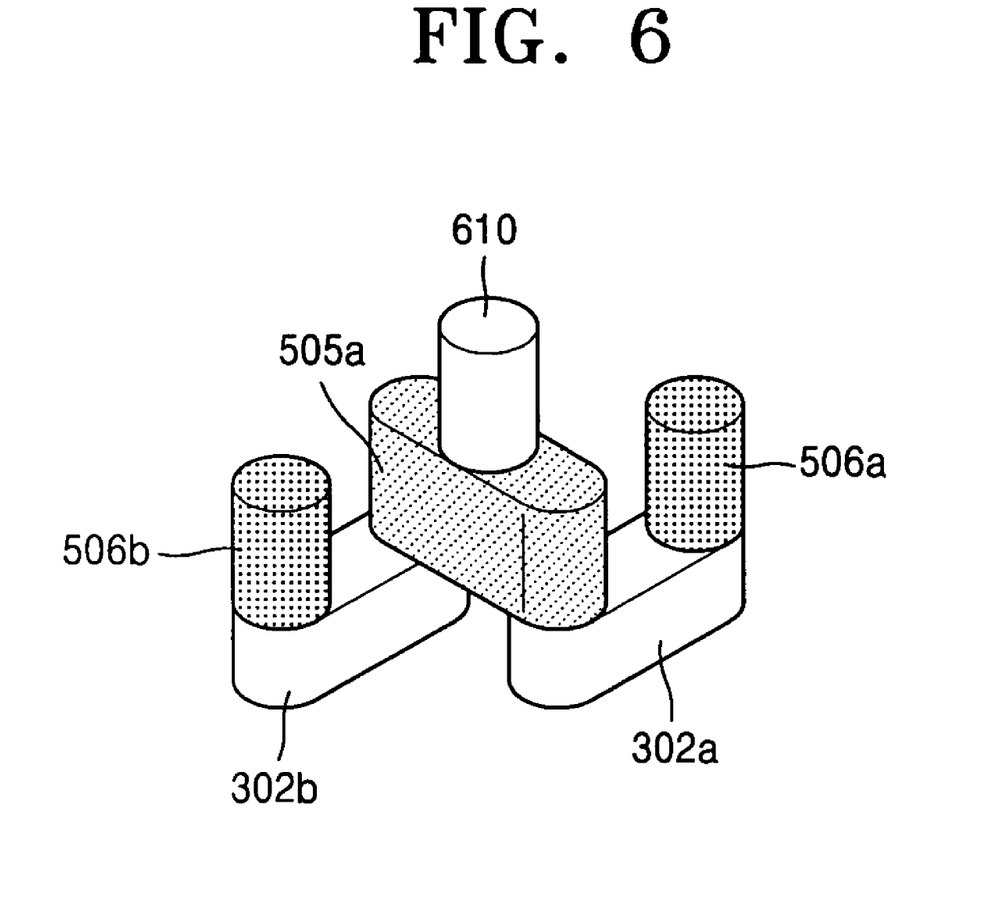
FIG. 6 is a view illustrating interconnection of the buried contacts and the direct contacts of FIG. 5.

FIG. 6 is a schematic perspective view illustrating interconnection of the buried contacts 506 and the direct contacts 505 of FIG. 5. The left-handed portion (i.e., left side as viewed in FIG. 6) of a first active region 302a and the right-handed portion (i.e., right side as viewed in FIG. 6) of a second active region 302b are connected to a direct contact 505a. A first buried contact 506a is disposed on the right-handed portion of the first active region 302a. In addition, a second buried contact 506b is disposed on the left-handed portion of the second active regions 302b. As described above, the direct contacts 505a connect an active region 302 to the bit line 304 and the buried contacts 506a and 506b connect active regions 302 to additional overlying layer features, such as lower electrodes of memory cell capacitors. Also shown in the embodiments of FIG. 6 is a direct contact plug 610 that is disposed on the direct contact 505a. While not shown in FIG. 6, the bit line 304 may then be formed on and electrically connected to the direct contact plug 610. It will be understood that reference to left-handed and right-handed as used herein are merely for purpose of distinguishing respective impurity regions and simplifying the present explanation and are not to be considered as otherwise limiting the present invention.

Figure 7:
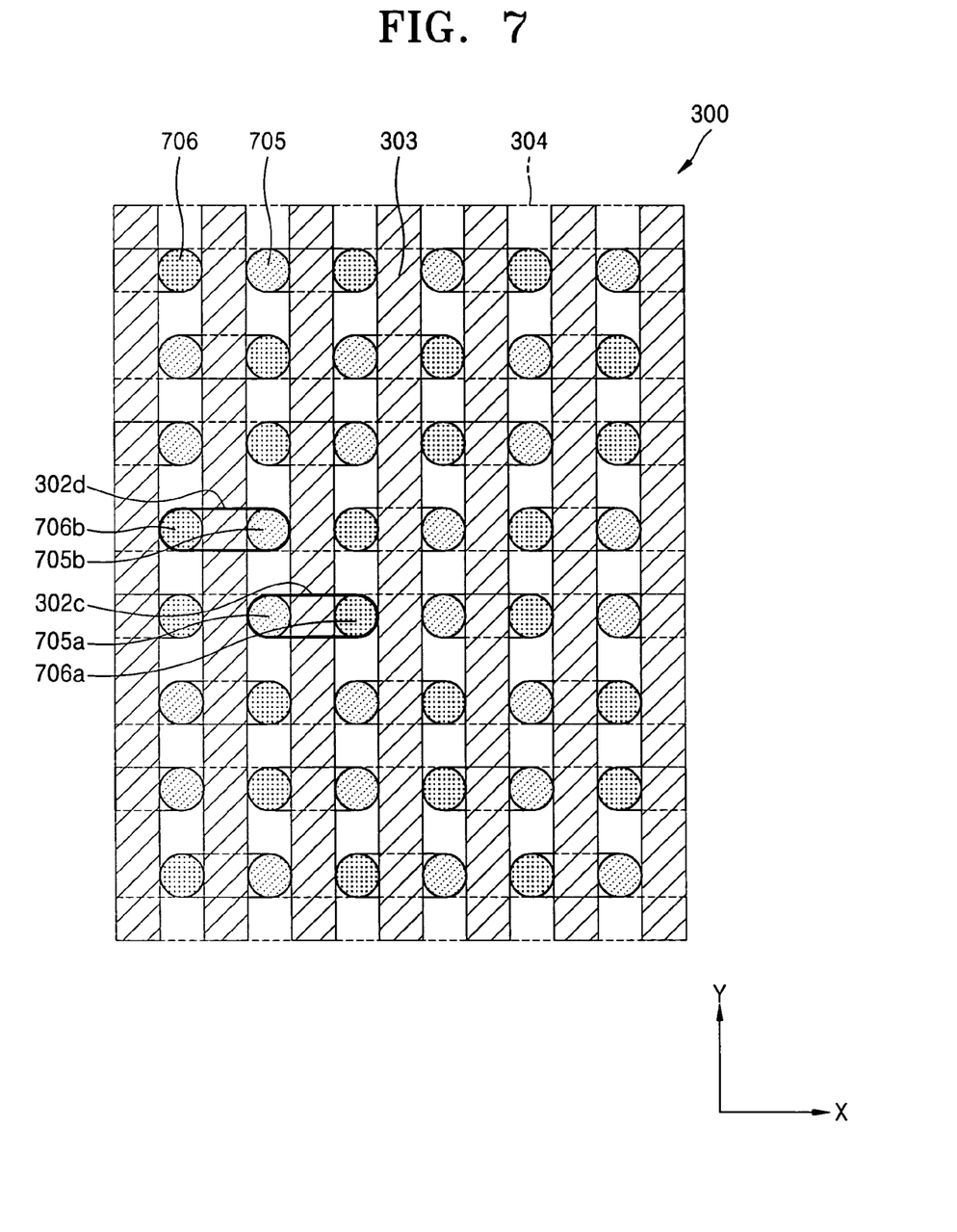
FIG. 7 is a view illustrating interconnection of the buried contacts and the direct contacts in a DRAM device having a $6F^2$ layout according to further embodiments of the present invention.

FIG. 7 is a layout view illustrating interconnection of buried contacts 706 and direct contacts 705 in a DRAM device having $6F^2$ layout according to further embodiments of the present invention. As shown in the embodiments of FIG. 7, the direct contacts 705 and the buried contacts 706 are formed on left-handed and right-handed impurity regions, respectively. Each of the buried contacts 706 associated with a bit line 304 is connected to an impurity region of an upper active region 302 above the bit line 304 and an impurity region of a lower active region 302 below the bit line 304.

Figure 8:
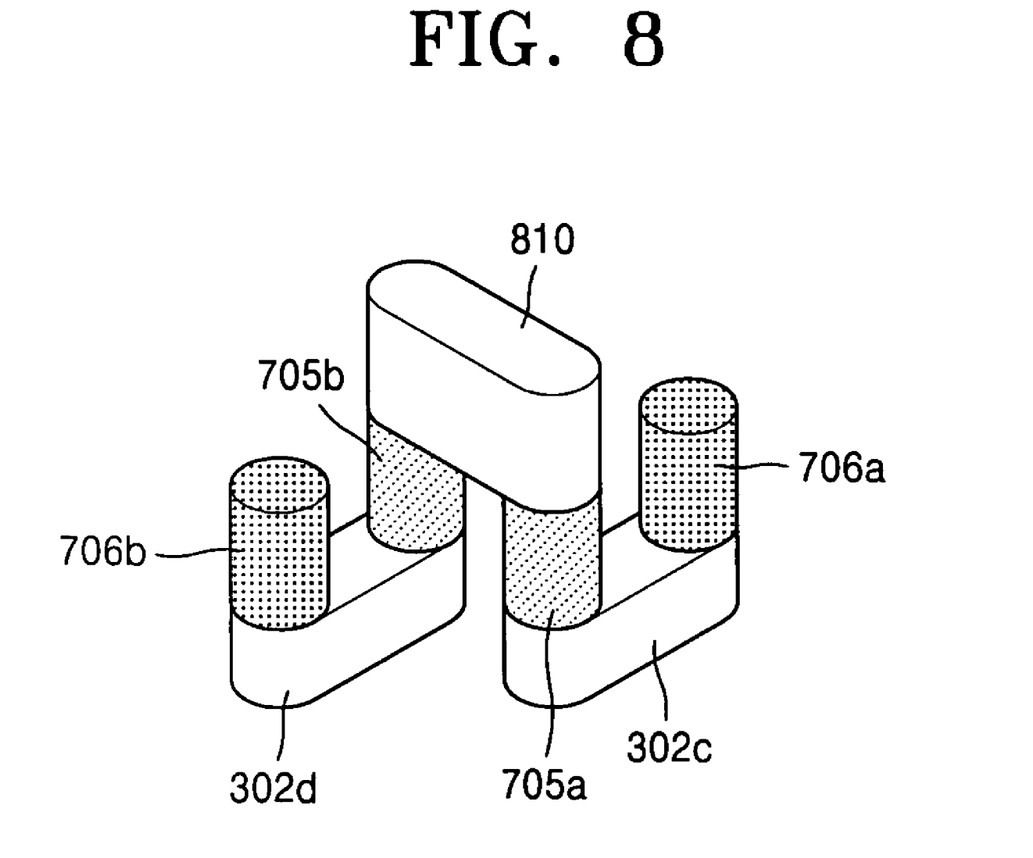
FIG. 8 is a view illustrating interconnection of the buried contacts and the direct contacts of FIG. 7.

FIG. 8 is a schematic perspective view illustrating interconnection of the buried contacts 706 and the direct contacts 705 of FIG. 7. As shown in the embodiments of FIG. 8, a first direct contact 705a and a second direct contact 705b are disposed on the left-handed portion of a first active region 302c and the right-handed portion of a second active region 302d, respectively. A first buried contact 706a is disposed on the right-handed portion of the first active region 302c. In addition, a second buried contact 706b is disposed on the left-handed portion of the second active region 302d. A direct contact plug 810 is disposed on the first and second direct contacts 705a and 705b to connect the first and second direct contacts 705a and 705b. In addition, the bit line 304 may be formed on and electrically connected to the direct contact plug 810.

It will be understood that the direct contacts 505, 705 and the buried contacts 506, 706 may be formed in manners other than those described above for purposes of illustrating some embodiments of the present invention. For example, instead of the contact-shaped mask patterns of FIGS. 5 and 7, bar-shaped or line-shaped mask patterns may be used to form the direct contacts and the buried contacts. In such embodiments, as the direct contacts may be symmetrically disposed, advantages may be derived in some DRAM device configurations.

In a DRAM device having $6F^2$ layout according to some embodiments of the present invention, active regions are disposed in a zigzag pattern in two adjacent lines extending parallel to bit lines and between the adjacent bit lines, and a single unit cell is formed in each of the active regions. In some embodiments of the present invention, it may be possible to increase a degree of integration of a DRAM device having a $6F^2$ layout. In addition, symmetry of the direct contacts and the buried contacts may be improved by using a self-aligned contact process. Therefore, it may be possible to more easily manufacture a DRAM device having a $6F^2$ layout.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A DRAM device comprising:
a plurality of word lines extending in a first direction;
a plurality of bit lines extending in a second direction and intersecting the word lines; and
a plurality of active regions electrically coupled to the word lines and the bit lines, each of the active regions defining a single unit memory cell having an area of $6F^2$ in terms of a minimum line width F, wherein each of the active regions is overlapped by only one word line and wherein the active regions are defined by an isolation region and wherein two active regions of the plurality of active regions on opposite sides of an adjacent one of the plurality of bit lines are electrically connected to the adjacent one of the plurality of bit lines.

2. The DRAM device of claim 1, wherein the active regions have a bar shape with curved ends.

3. The DRAM device of claim 1, wherein the active regions are arranged in rows extending in the second direction and wherein two rows of active regions are positioned between an adjacent pair of the bit lines.

4. The DRAM device of claim 3, wherein the two rows of active regions are arranged in a zigzag pattern.

5. A DRAM device comprising:
a plurality of word lines extending in a first direction;
a plurality of bit lines extending in a second direction and intersecting the word lines; and
a plurality of active regions electrically coupled to the word lines and the bit lines, each of the active regions defining a single unit memory cell having an area of $6F^2$ in terms of a minimum line width F, wherein the plurality of active regions comprises a first set of active regions aligned with a first line extending in the second direction and a second set of active regions aligned with a second line extending in the second direction, the first set and second set of active regions extending between upper and lower adjacent ones of the plurality of bit lines and wherein the first and second lines are proximate the upper and lower bit lines, respectively.

6. The DRAM device of claim 5, wherein the first and second sets of active regions are disposed in a zigzag pattern.

7. The DRAM device of claim 6, further comprising:
direct contacts electrically connecting the active regions to the bit lines; and
buried contacts electrically connecting the active regions to overlying layers of the DRAM device.

8. The DRAM device of claim 7, wherein:
ones of the direct contacts are formed on both a first impurity region of one of the first set of active regions and a second impurity region of an associated one of the second set of active regions;
one of the buried contacts is formed on a second impurity region of the one of the first set of active regions and another of the buried contacts is formed on a first impurity region of the one of the second set of active regions, and
wherein the first and second impurity regions of the active regions are partitioned by one of the word lines.

9. The DRAM device of claim 7, further comprising a direct contact plug disposed on each of the direct contacts to connect the direct contacts to corresponding ones of the plurality of bit lines.

10. The DRAM device of claim 5, wherein:
one of the direct contacts is formed on a first impurity region of each of the first set of active regions;
another one of the direct contacts is formed on a second impurity region of an associated one of the second set of active regions;
one of the buried contacts is formed on a second impurity region of each of the first set of active regions and another of the buried contacts is formed on a first impurity region of each of the second set of active regions; and
the first and second impurity regions of each of the active regions are partitioned by one of the word lines.

11. The DRAM device of claim 10, further comprising, a direct contact plug disposed the one of the direct contacts and the another one of the direct contacts for an associated one of the first set of active regions and one of the second set of active regions that connects the one of the direct contacts and the another one of the direct contacts.

12. A DRAM device, comprising:
a plurality of word lines extending in a first direction;
a plurality of bit lines extending in a second direction and intersecting the word lines; and
a plurality of active regions arranged in rows extending in the second direction, wherein two rows of the active regions are positioned between an adjacent pair of the bit lines;
wherein each of the active regions is overlapped by only one word line and defines a single unit memory cell and wherein the active regions are defined by an isolation region and wherein two active regions of the plurality of active regions on opposite sides of an adjacent one of the plurality of bit lines are electrically connected to the adjacent one of the plurality of bit lines.

13. The DRAM device of claim 12, wherein the two rows of the active regions are arranged in a zigzag pattern.

14. The DRAM device of claim 12, further comprising:
direct contacts electrically connecting the active regions to the bit lines; and
buried contacts electrically connecting the active regions to overlying layers of the DRAM device.

15. The DRAM device of claim 14, wherein one of the two rows comprises a first set of the active regions and another of the two rows comprises a second set of the active regions and wherein:
ones of the direct contacts are formed on both a first impurity region of one of the first set of active regions and a second impurity region of an associated one of the second set of active regions;

one of the buried contacts is formed on a second impurity region of the one of the first set of active regions and another of the buried contacts is formed on a first impurity region of the one of the second set of active regions, and wherein the first and second impurity regions of the active regions are partitioned by one of the word lines.

16. The DRAM device of claim 15, further comprising a direct contact plug disposed on each of the direct contacts to connect the direct contacts to corresponding ones of the plurality of bit lines.

17. The DRAM device of claim 14, wherein one of the two rows comprises a first set of active regions and another of the two rows comprises a second set of active regions and wherein:

one of the direct contacts is formed on a first impurity region of each of the first set of active regions;

another one of the direct contacts is formed on a second impurity region of an associated one of the second set of active regions;

one of the buried contacts is formed on a second impurity region of each of the first set of active regions and another of the buried contacts is formed on a first impurity region of each of the second set of active regions, and wherein the first and second impurity regions of each of the active regions are partitioned by one of the word lines.

18. The DRAM device of claim 17, further comprising, a direct contact plug disposed the one of the direct contacts and the another one of the direct contacts for an associated one of the first set of active regions and one of the second set of active regions that connects the one of the direct contacts and the another one of the direct contacts.

19. A DRAM device, comprising:

word lines extending in a first direction;

bit lines extending in a second direction and intersecting the word lines; and active regions defined by an isolation region, wherein a single word line is overlapped with a single active region so that a single unit memory cell is formed in the single active region and wherein two active regions are disposed in a zigzag pattern in the first direction between adjacent ones of the bit lines and wherein two active regions of the plurality of active regions on opposite sides of an adjacent one of the plurality of bit lines are electrically connected to the adjacent one of the plurality of bit lines.

20. The DRAM device of claim 19, wherein the unit memory cell has an area of $6F^2$ in terms of a minimum line width F.

* * * * *